(12) United States Patent
Smith et al.

(10) Patent No.: US 9,281,037 B2
(45) Date of Patent: Mar. 8, 2016

(54) MEMORY DEVICE COMMAND DECODING SYSTEM AND MEMORY DEVICE AND PROCESSOR-BASED SYSTEM USING SAME

(75) Inventors: Scott Smith, Plano, TX (US); Duc Ho, Allen, TX (US); J. Thomas Pawlowski, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 12/776,154

(22) Filed: May 7, 2010

(65) Prior Publication Data

US 2010/0214864 A1 Aug. 26, 2010

Related U.S. Application Data

(62) Division of application No. 11/899,738, filed on Sep. 6, 2007, now Pat. No. 7,729,191.

(51) Int. Cl.
*G11C 5/14* (2006.01)
*G11C 8/00* (2006.01)
*G11C 8/18* (2006.01)
*G11C 7/10* (2006.01)
*G11C 11/406* (2006.01)
*G11C 11/4074* (2006.01)
*G11C 11/4096* (2006.01)

(52) U.S. Cl.
CPC ............... *G11C 8/18* (2013.01); *G11C 7/1066* (2013.01); *G11C 7/1072* (2013.01); *G11C 11/406* (2013.01); *G11C 11/4074* (2013.01); *G11C 11/4096* (2013.01); *G11C 11/40615* (2013.01); *G11C 2207/2227* (2013.01); *G11C 2211/4067* (2013.01); *G11C 2211/4068* (2013.01)

(58) Field of Classification Search
USPC .................. 365/193, 233.16, 233.17, 233.18, 365/233.19, 222, 203, 230.03, 233.1, 365/226–229, 233.5, 230.06, 233.11, 365/233.13; 711/105
See application file for complete search history.

(56) References Cited

U.S. PATENT DOCUMENTS

| | | | | |
|---|---|---|---|---|
| 5,636,173 A * | 6/1997 | Schaefer | ..................... | 365/233.1 |
| 5,926,434 A * | 7/1999 | Mori | .............................. | 365/227 |
| 6,021,082 A * | 2/2000 | Shirai | ........................... | 365/226 |
| 6,240,048 B1 * | 5/2001 | Matsubara | ............... | 365/233.17 |
| 6,307,779 B1 * | 10/2001 | Roohparvar | ............... | 365/233.1 |
| 6,347,063 B1 * | 2/2002 | Dosaka et al. | ........... | 365/230.03 |
| 6,353,561 B1 * | 3/2002 | Funyu et al. | ............. | 365/230.06 |
| 6,480,439 B2 * | 11/2002 | Tokutome et al. | ........ | 365/233.17 |
| 6,496,444 B2 * | 12/2002 | Roohparvar | ............. | 365/233.11 |
| 6,510,096 B2 * | 1/2003 | Choi et al. | ..................... | 365/226 |
| 6,512,715 B2 * | 1/2003 | Okamoto et al. | ............. | 365/227 |
| 6,560,158 B2 * | 5/2003 | Choi et al. | ..................... | 365/226 |
| 6,570,791 B2 * | 5/2003 | Roohparvar et al. | .... | 365/233.13 |

(Continued)

*Primary Examiner* — Trong Phan
(74) *Attorney, Agent, or Firm* — Dorsey & Whitney LLP

(57) ABSTRACT

Systems, devices and methods are disclosed. In an embodiment of one such method, a method of decoding received command signals, the method comprises decoding the received command signals in combination with a signal provided to a memory address node at a first clock edge of a clock signal to generate a plurality of memory control signals. The received command signals, in combination with the signal provided to the memory address node at the first clock edge of the clock signal, represent a memory command. Furthermore, the signal provided to the memory address node at a second clock edge of the clock signal is not decoded in combination with the received command signals. The memory command may be a reduced power command and/or a no operation command.

24 Claims, 5 Drawing Sheets

(56) References Cited

U.S. PATENT DOCUMENTS

| | | | |
|---|---|---|---|
| 6,577,553 B2 * | 6/2003 | Makabe et al. | 365/230.06 |
| 6,667,905 B2 * | 12/2003 | Dono et al. | 365/230.03 |
| 6,674,684 B1 * | 1/2004 | Shen | 365/230.03 |
| 6,721,223 B2 * | 4/2004 | Matsumoto et al. | 365/222 |
| 6,744,687 B2 * | 6/2004 | Koo et al. | 365/226 |
| 6,781,911 B2 * | 8/2004 | Riesenman et al. | 365/226 |
| 6,892,270 B2 * | 5/2005 | Roohparvar | 711/105 |
| 7,073,014 B1 * | 7/2006 | Roohparvar | 365/233.11 |
| 7,212,465 B2 * | 5/2007 | Kang | 365/233.1 |
| 7,460,428 B2 * | 12/2008 | Joo et al. | 365/226 |
| 7,606,105 B2 * | 10/2009 | Chu | 365/226 |
| 7,693,000 B2 * | 4/2010 | Taruishi et al. | 365/230.03 |
| 7,843,745 B2 * | 11/2010 | Choi | 365/233.1 |
| 7,869,301 B2 * | 1/2011 | Cowles et al. | 365/230.03 |

\* cited by examiner

| Command | RAS | CAS | WE | \multicolumn{8}{c}{Address received with command on rising edge of clock} | \multicolumn{8}{c}{Address received after command on falling edge of clock} |
|---|---|---|---|---|---|---|---|---|---|---|---|---|---|---|---|---|---|---|---|
| | | | | 7 A7R | 6 A6R | 5 A5R | 4 A4R | 3 A3R | 2 A2R | 1 A1R | 0 A0R | 15 A7F | 14 A6F | 13 A5F | 12 A4F | 11 A3F | 10 A2F | 9 A1F | 8 A0F |
| ACTV | L | H | H | R7 | R6 | R5 | R4 | R3 | R2 | R1 | R0 | X | X | R13 | R12 | R11 | R10 | R9 | R8 |
| PREC | L | H | L | X | X | X | X | X | X | X | X | X | X | X | X | X | X | X | X |
| RFSH | L | L | H | X | X | X | X | X | X | X | X | X | X | X | X | X | X | X | X |
| PDE | H | H | H | 0 | 0 | X | X | X | X | X | X | X | X | X | X | X | X | X | X |
| PDESR | H | H | H | 0 | 1 | X | X | X | X | X | X | X | X | X | X | X | X | X | X |
| PDEDP | H | H | H | 1 | X | X | X | X | X | X | X | X | X | X | X | X | X | X | X |
| NOP | H | H | H | X | X | X | X | X | X | X | X | X | X | X | X | X | X | X | X |
| READ | H | L | H | C9 | C8 | C7 | C6 | C5 | C4 | C3 | C2 | 0 | X | X | X | X | X | X | C0 |
| READ AP | H | L | H | C9 | C8 | C7 | C6 | C5 | C4 | C3 | C2 | 1 | X | X | X | X | X | X | C0 |
| WRITE | H | L | L | C9 | C8 | C7 | C6 | C5 | C4 | C3 | C2 | 0 | X | CF | CF | X | X | C1 | C0 |
| WRITE AP | H | L | L | C9 | C8 | C7 | C6 | C5 | C4 | C3 | C2 | 1 | X | CF | CF | X | X | C1 | C0 |
| MRS0 | L | L | L | M7 | 0 | 0 | M4 | M3 | M2 | M1 | M0 | M15 | M14 | M13 | M12 | M11 | M10 | M9 | M8 |
| MRS1 | L | L | L | M7 | 0 | 1 | M4 | M3 | M2 | M1 | M0 | M15 | M14 | M13 | M12 | M11 | M10 | M9 | M8 |

FIGURE 2

MEMORY DEVICE COMMAND DECODING SYSTEM AND MEMORY DEVICE AND PROCESSOR-BASED SYSTEM USING SAME

CROSS-REFERENCE TO RELATED APPLICATION

This application is a divisional of U.S. patent application Ser. No. 11/899,738, filed Sep. 6, 2007, U.S. Pat. No. 7,729,191, issued on Jun. 1, 2010. This application and patent are incorporated by reference herein in their entirety and for all purposes.

TECHNICAL FIELD

This invention relates generally to memory devices, and, more particularly to decoding various reduced power commands in memory devices.

BACKGROUND OF THE INVENTION

Memory devices, such as DRAM devices, have a large number of signal terminals for receiving command, address and write data signals and for transmitting read data signals. The large number of terminals is generally required for memory devices used in most electronic systems, such as computer systems, that include a large number of such memory devices.

The command signals that are applied to memory devices are well-established and have been in common use for many years. Not only are users familiar with such commands, but devices used with memory devices, such as memory controllers, are specifically designed with such commands in mind. It would therefore be inconvenient to use or sell memory devices that use a command set that is different from this commonly used set of commands. Command signals for dynamic random access memory ("DRAM") devices, for example, receive a number of command signals at respective terminals. These command signals are generally clock enable CKE#, chip select CS#, write enable WE#, row address strobe RAS# and column address strobe CAS# signals, where the "#" indicates the signal is active low.

It would be desirable to reduce the number of signals and corresponding terminals that memory devices use to interface with other devices, such as processors or memory controllers. However, the currently used command signals are generally considered necessary to implement all of the desired functionality of memory devices. Therefore, it has been considered impractical to reduce the number of command signals that must be provided to memory devices.

BRIEF DESCRIPTION OF THE DRAWINGS

FIG. 2 is a command decode table used by a command decoder in the memory device of FIG. 1.

DETAILED DESCRIPTION

Figure 1:
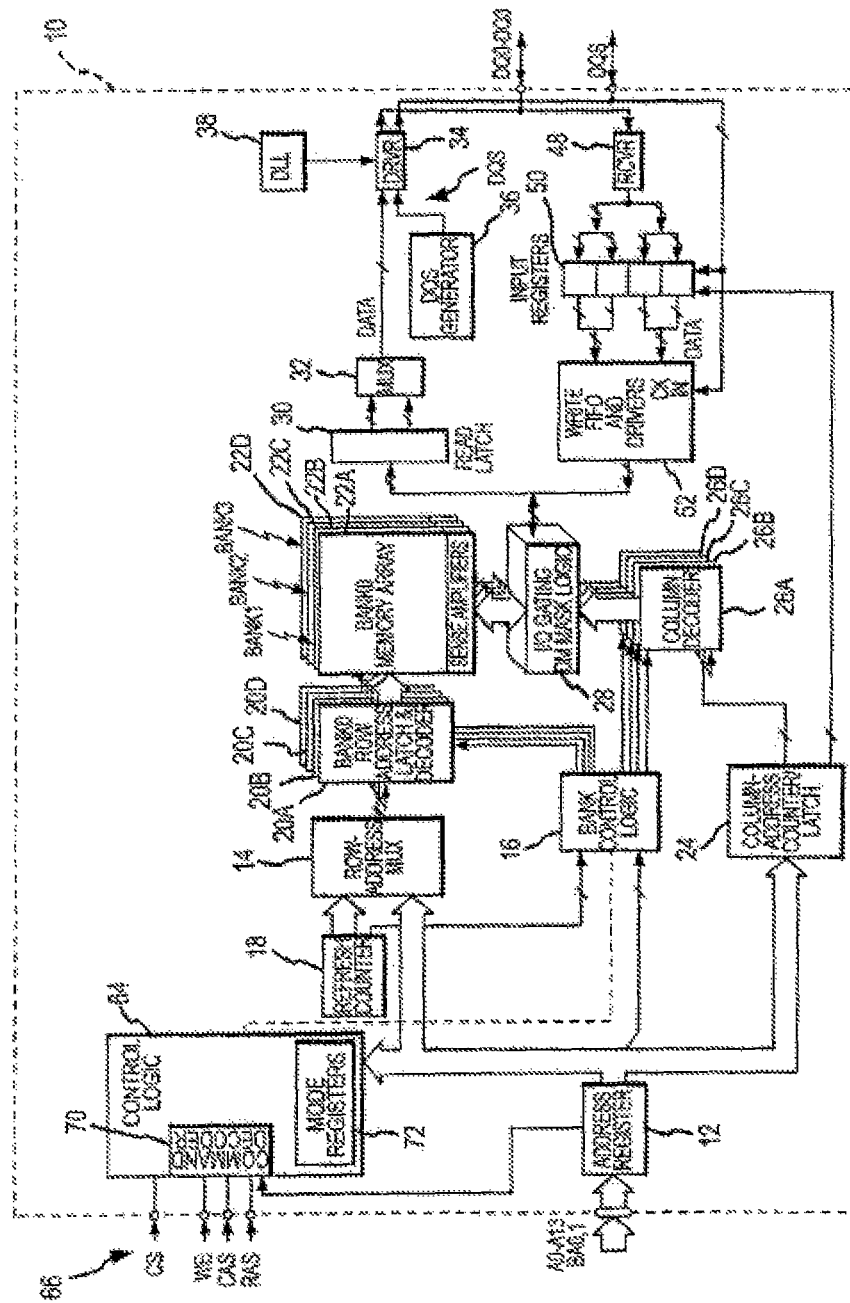
FIG. 1 is a block diagram of a memory device according to one embodiment of the invention.

FIG. 1 shows a dynamic random access memory ("DRAM") device 10 according to one embodiment of the invention. The memory device 10 is a double-data rate (DDR) synchronous dynamic random access memory ("SDRAM"), although the principles described herein are applicable to any memory device that receives memory commands. The memory device 10 includes an address register 12 that receives row, column, and bank addresses A0-A13, BA0,1 over an address bus, with a memory controller (not shown) typically supplying the addresses. The address register 12 receives a row address and a bank address that are applied to a row address multiplexer 14 and bank control logic circuit 16, respectively. The row address multiplexer 14 applies either the row address received from the address register 12 or a refresh row address from a refresh counter 18 to a plurality of row address latch and decoders 20a-d. The bank control logic 16 activates the row address latch and decoder 20a-d corresponding to either the bank address received from the address register 12 or a refresh bank address from the refresh counter 18, and the activated row address latch and decoder latches and decodes the received row address. In response to the decoded row address, the activated row address latch and decoder 20a-d applies various signals to a corresponding memory bank 22a-d BANK0-BANK3 to thereby activate a row of memory cells corresponding to the decoded row address. Each memory bank 22a-d includes a memory-cell array having a plurality of memory cells arranged in rows and columns, and the data stored in the memory cells in the activated row is stored in sense amplifiers in the corresponding memory bank. The row address multiplexer 14 applies the refresh row address from the refresh counter 18 to the decoders 20a-d and the bank control logic circuit 16 uses the refresh bank address from the refresh counter 18 when the memory device 10 operates in an auto-refresh or self-refresh mode of operation in response to an auto- or self-refresh command being applied to the memory device 10, as will be appreciated by those skilled in the art.

A column address is applied on the ADDR bus after the row and bank addresses, and the address register 12 applies the column address to a column address counter and latch 24 which, in turn, latches the column address and applies the latched column address to a plurality of column decoders 26a-d. The bank control logic 16 activates the column decoder 26a-d corresponding to the received bank address, and the activated column decoder decodes the applied column address. Depending on the operating mode of the memory device 10, the column address counter and latch 24 either directly applies the latched column address to the decoders 26a-d, or applies a sequence of column addresses to the decoders starting at the column address provided by the address register 12. In response to the column address from the counter and latch 24, the activated column decoder 26a-d applies decode and control signals to an I/O gating and data masking circuit 28 which, in turn, by way of the SENSE AMPLIFIERS accesses memory cells corresponding to the decoded column address in the activated row of memory cells in the memory bank 22a-d being accessed.

During data read operations, data being read from the addressed memory cells is coupled through the I/O gating and data masking circuit 28 to a read latch 30. The I/O gating and data masking circuit 28 supplies N bits of data to the read latch 30, which then applies two N/2 bit words to a multiplexer 32. A data driver 34 sequentially receives the N/2 bit words from the multiplexer 32 and also receives a data strobe signal DQS from a strobe signal generator 36 ("DQS GENERATOR") and a delayed clock signal from a delay-locked loop ("DLL") 38. The DQS signal is used by an external circuit such as a memory controller (not shown) in latching data from the memory device 10 during read operations. In response to the delayed clock signal from the DLL 38, the data driver 34 sequentially outputs the received N/2 bits words as a corresponding data word on a data bus DQ. The data driver 34 also outputs the data strobe signal DQS having rising and falling edges in synchronism with the data word.

During data write operations, an external circuit such as a memory controller (not shown) applies N/2 bit data words to the memory device 10 through the data bus DQ. The external circuit also applies the strobe signal DQS to the memory device 10. A data receiver 48 (RCVRS) receives each data word, and applies corresponding write data signals to input registers 50 that are clocked by the DQS signal. In response to a rising edge of the DQS signal, the input registers 50 latch a first N/2 bit word, and in response to a falling edge of the DQS signal the input registers latch the second N/2 bit word. The input register 50 provides the two latched N/2 bit words as an N-bit word to a write FIFO and driver 52, which clocks the applied write data word into the write FIFO and driver 52 in response to the DQS signal. The write data word is clocked out of the write FIFO and driver 52 in response to the CK signal (CK IN), and is applied to the I/O gating and masking circuit 28. The I/O gating and masking circuit 28 transfers the DQ word to the addressed memory cells in the accessed bank 22*a-d*.

A control logic unit 64 receives a plurality of command and clock signals over a control bus 66, typically from an external circuit such as a memory controller (not shown). The command signals include a write enable signal WE, a column address strobe signal CAS, and a row address strobe signal RAS, all of which are active high. These command and clock signals are decoded by a command decoder 70 in the control logic unit 64, as described in greater detail below. The command decoder 70 causes address signals and data signals to be latched at both the rising edge of the CK signal (i.e., the crossing of CK from low-to-high) and the falling edge of the CK signal (i.e., the crossing of CK from high-to-low), while the data drivers 34 and the input registers 50 transfer data to and from, respectively, the data bus DQ in response to both edges of the data strobe signal DQS. The command decoder 70 receives signals from the address register 12 for reasons that will be explained below. The control logic unit 64 also includes mode registers 72 that can be programmed to control various operating modes, as is conventional in memory devices. The command decoder 70 also receives signals from the address register 12 for reasons that will be explained below.

Unlike conventional DRAM devices, the memory device 10 does not receive a chip select signal CS# or a clock enable signal CKE#, thereby reducing the number of command signals by two. To preserve all of the functionality of the memory device 10, the command decoder 70 should be adapted to perform all of the operations typically performed by a DRAM device without the use of the command signals that are typically decoded to designate those operations. The manner in which the command decoder 70 is able to perform those functions will be described in greater detail below. In response to the clock signal CK, the control logic unit 64 generates a sequence of clocking and control signals that control the components of the memory device 10 to perform the corresponding operations.

One of the problems with the memory device 10 using a limited number of commands is that some of the operations performed responsive to respective commands place the memory device in a mode where it is no longer operating other than to retain data stored in the memory cells of the memory banks 22*a-d*. The limited number of commands should be able to transition the memory device 10 back to a completely operable mode, and do so in a manner that does not result in spurious operations or other operations that might result in data loss.

The power down operations performed by the memory device 10 are a precharge power down operation, an active power down operation and a deep power down operation. In both power down operations, power is removed from input buffers in the address register 12 and the data receiver 48, and power is also removed from input buffers in the control logic unit 64 that receive some of the command signals. However, at least one input buffer in the control logic unit 64 remains powered to pass a signal that commands the memory device 10 to transition out of the power down mode. Also, in both power down modes, power continues to be applied to the components needed to refresh the memory cells in the banks 22*a-d*. In the active power down mode, which is automatically entered responsive to a power down command if a row of memory cells is currently open, the row remains active so the memory cells in the row can be quickly read. Finally, in the deep power down mode, the entire memory device 10 is powered down except for a single input buffer needed to pass a command signal to maintain the memory device in that mode. The command decoder 70 in the control logic unit 64 can also decode other commands such a read, write, no operation, precharge, active, and refresh commands.

In prior art memory devices, all three of these power down commands are normally signaled by the CKE# signal transitioning low in combination with other command signals. The power down modes are normally terminated by the CKE# signal transitioning high. Similarly, the auto-refresh command is normally differentiated from the self-refresh command by the state of the CKE# signal. However, in the memory device 10, the CKE# command signal is not used. Moreover, the RAS, CAS and WE signals, which are used, are used for other purposes and are thus generally unavailable to take the place of the CKE# signal. This problem is solved by decoding the RAS, CAS and WE signals, along with certain address signals, according to the command decode table shown in FIG. 2. It is for this reason that the command decoder 70 receives signals from the address register 12.

With reference to FIG. 2, the command decoder 70 groups the commands into the 8 possible sets of commands that can be obtained from the 3 binary command signals RAS, CAS and WE. FIG. 2 illustrates the state of each binary command signal represented as "H" for high and "L" for low. The Active command ACTV, the precharge command PREC and the auto refresh command RFSH all have unique combinations of the RAS, CAS and WE commands. Other commands are grouped together, with the commands in each group being differentiated from each other by address signals clocked into the command decoder 70 on either the rising edge or the falling edge of the CK signal. The commands that are grouped and differentiated from each other by address signals are chosen to be commands that do not require the decoding of at least some of the address signals. For example, the command decoder 70 differentiates between the power down and refresh commands PDE, all of which are signaled by the same combination of the RAS, CAS and WE commands, i.e., "110," by examining the A7 and A6 address bits latched on the rising edge of the CK signal, which are designated as the A7R and A6R bits, respectively. The normal power down command (whether active power down or precharge power down) is signaled by decoding the A7R, A6R bits as "00," the power down self-refresh command is signaled by decoding the A7R, A6R bits as "01," and the deep power down command is signaled by decoding the A7R bit as "1."

The no operation command NOP is signaled by decoding RAS, CAS and WE signals as "111." This decoding scheme is advantageous because the command "111" is differentiated from the command "110" for the power down and self-refresh modes only by the state of the WE signal. As a result, when the memory device 10 transitions out of one of the power down modes responsive to the WE signal transitioning from low-to-high, the command decoder 70 signals the memory device 10 to perform no operation, thereby avoiding spurious data from being written to or read from the memory device 10.

The READ commands are signaled by decoding the RAS, CAS and WE signals as "101," and differentiated from each other by the state of the A7 address signal latched on the falling edge of the CK signal, which is designated as the A7F bit. The normal read command READ is signaled by decoding the A7F signal as "0," and the auto precharge read command READ AP is signaled by decoding the A7F signal as "1." The addresses for a read command are applied to the address register 12 as A7-A0 signals latched on the rising edge of the CK signal (C2-C9) and the A2-A0 signals latched on the falling edge of the CK signal (C0, C1, CF), which are designated as the A7R-A0R and A2F-A0F bits, respectively. Similarly, the WRITE commands are signaled by decoding the RAS, CAS and WE signals as "100," and also differentiated from each other by the state of the A7 address signal latched on the falling edge of the CK signal, which is designated as the A7F bit. The normal write command WRITE is signaled by decoding the A7F signal as "0," and the auto precharge write command WRITE AP is signaled by decoding the A7F signal as "1." The addressing scheme for a write command is the same as the above-explained addressing scheme for a read command.

There are also commands MRS0 and MRS1 for loading the mode registers 72, which are signaled by decoding the RAS, CAS and WE signals as "000," and differentiated from each other by the state of the A5 address signal latched on the rising edge of the CK signal, which is designated as the A5R bit. A first of the mode registers 72 is programmed responsive to the A5R bit being decoded as "0," and a second of the mode registers 72 is programmed responsive to the A5R bit being decoded as "1." The mode registers 72 are programmed with data applied to the address register 12 as A7, A6 and A4-A0 signals latched on the rising edge of the CK signal, and as A7-A8 signals latched on the falling edge of the CK signal, which are designated as the A7R, A6R and A4R-0 and A7F-A8F bits, respectively.

Although the active command ACTV is signaled by uniquely decoding the RAS, CAS and WE signals, it requires an address to designate the row of memory cells that is to be activated. The addresses for the ACTV command are applied to the address register 12 as A7-A0 signals latched on the rising edge of the CK signal and A5-A0 signals latched on the falling edge of the CK signal.

The command decoding scheme shown in FIG. 2 allows the memory device 10 to perform all necessary operations despite the absence of the CKE# and CS# command signals typically found in DRAM memory devices. Although the absence of the chip select CS# signal can make it more difficult to use multiple memory devices 10 in a system, it is possible to provide commands to separate memory devices 10 in a system by applying a separate WE signal to each of the memory devices 10 in the same manner that the CS# signal is normally used.

Figure 3:
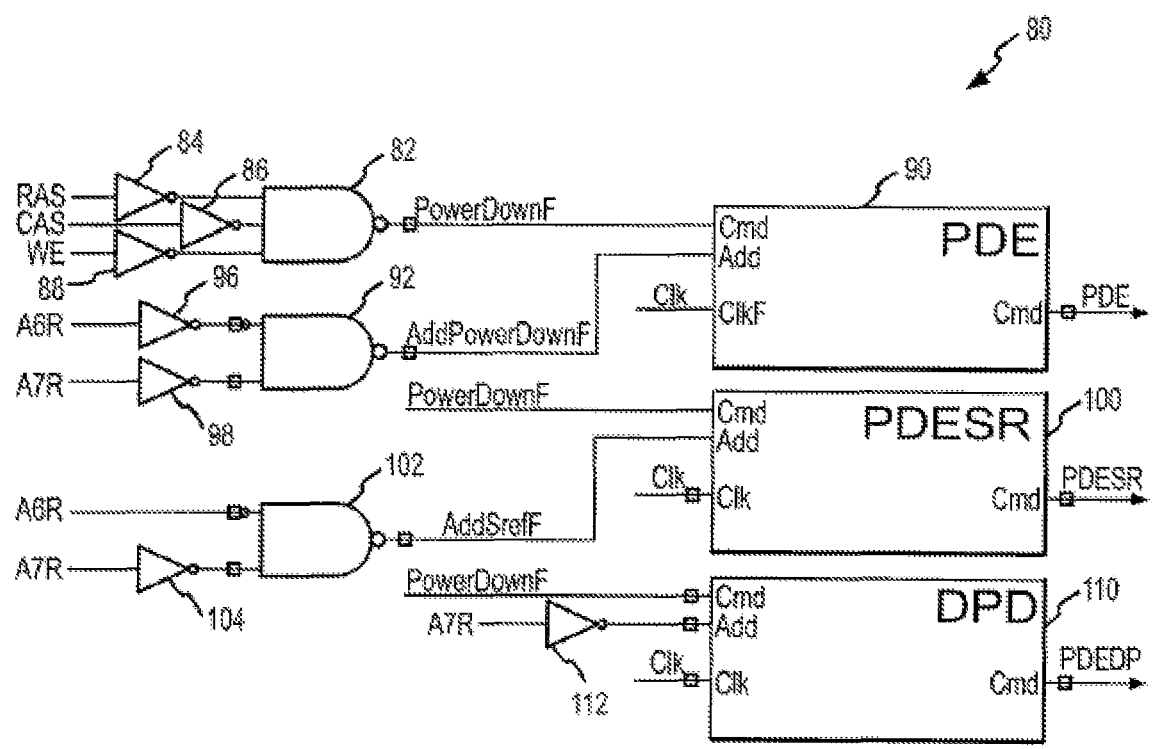
FIG. 3 is an embodiment of a portion of a command decoder in the memory device of FIG. 1.

An embodiment of a portion of a decoder circuit 80 that may be used in the command decoder 70 to decode the RAS, CAS and WE commands is shown in FIG. 3. The decoder circuit 80 includes a NAND gate 82 that receives the RAS, CAS and WE signals through respective inverters 84, 86, 88. The NAND gate 82 therefore outputs a low PowerDownF signal (with the "F" indicating the signal is active low) only if the RAS, CAS and WE signals are "111." Otherwise, the PowerDownF signal is inactive high. The output of the NAND gate 82 is applied to a data input of a latch 90, which also receives an output of a NAND gate 92. The NAND gate 92 receives A6R and A7R signals from the address register 12 through respective inverters 96, 98. As explained above, the A6R and A7R signals correspond to the A6 and A7 signals, respectively, latched on the rising edge of the CK signal, as shown in FIG. 2. It will be recalled that both of these signals will be high only when the power down command is a precharge power down command, i.e., not a self-refresh or a deep power down command. Therefore, the NAND gate 92 will output an active low AddPowerDownF signal only if the power down command is not a self-refresh or a deep power down command. If the signal applied to the Cmd and Add inputs to the latch 90 are both active low, which occurs responsive to a normal power down command, the latch 90 outputs an active high PDE command responsive to a Clk signal to indicate the normal power down command (either active power down or precharge power down depending upon the operation currently being performed). The Clk signal is generated responsive by delay circuitry (not shown) responsive to the CK signal after a suitable delay.

The PowerDownF signal from the NAND gate 82 is also applied to the Cmd input of a second latch 100, which receives an output from a NAND gate 102 at its Add input. The NAND gate 102, in turn, receives the A6R signal at one input and the A7R signal through an inverter 104. It will be recalled that, during a power down command, the A6 signal latched on the rising edge of the CK signal is high and the A7 signal latched on the rising edge of the CK signal is low only if the command is a power down self-refresh command. Therefore, in response to the decoding A7R, A6R as "01," the NAND gate 102 outputs an active low AddSrefF signal. In response, to the low PowerDownF and AddSrefF signals, the latch 100 outputs an active high PDESR command in response to the Clk signal to indicate the power down self-refresh command.

Similarly, a third latch 110 also receives the PowerDownF signal at its Cmd input. The latch 110 also receives the A7R signal through an inverter 112. It will be recalled that the A7 signal latched by the rising edge of the CK signal is high during a power down command only for a deep power down command. Therefore, in response to the Clk signal, the latch 110 outputs an active high PDEDP command responsive to decoding the A7R signal as "1."

Figure 4:
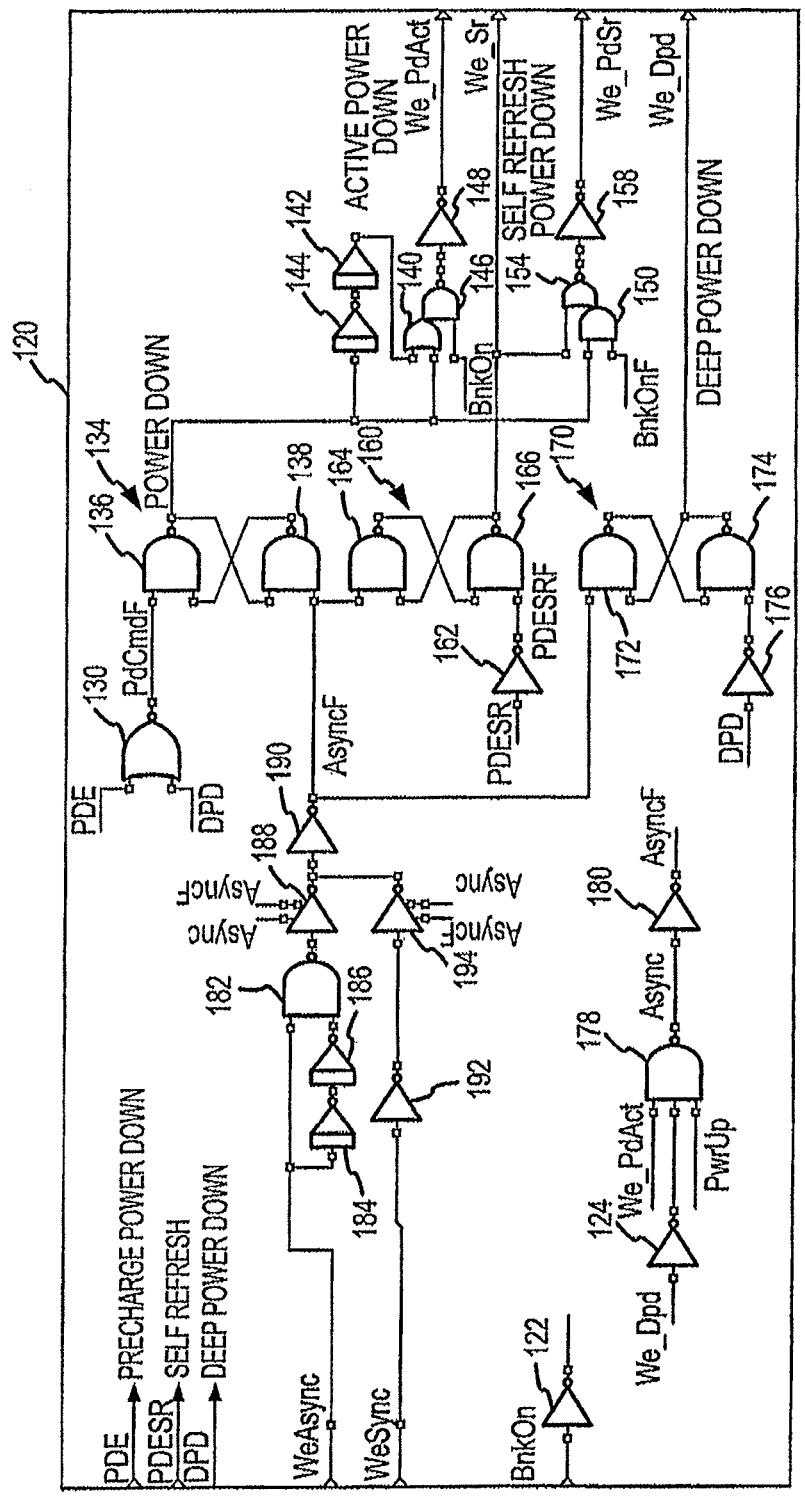
FIG. 4 is an embodiment of a portion of a command decoder in the memory device of FIG. 1.

An embodiment of a portion of a decoder circuit 120 that may be used in the command decoder 70 to terminate the power down and self-refresh operations responsive to the WE command transitioning high is shown in FIG. 4. In addition to the signals output from the decoder circuit 80 of FIG. 3, the decoder circuit 120 receives a BknOn signal that is passed through an inverter 122 to generate an BnkOnF signal that is active low whenever a row in a bank is open. The decoder circuit 120 also receives a We_Dpd signal at an input to an inverter 124, which is active high whenever the memory device 10 is in the deep power down mode. Finally, the decoder circuit 120 receives a WeAsync signal and a WeSync signal. Both the WeAsync signal and the WeSync signal transition high when the WE signal is asserted high. The WeSync signal is generated at the output of a latch (not shown) in the command decoder 70. As mentioned above, the latch is clocked by the CK signal. However, in the power down modes other than the active power down mode, the buffer (not shown) that passes the CK signal is not powered. Therefore, the rising edge of the WE signal latched by the CK signal could not be detected. For this reason, a WeAsync signal is generated at the output of a buffer (not shown) that passes the WE signal. This buffer, unlike the latch that receives the output of the buffer, remains powered in all power down and self-refresh modes. Thus, the WeSync signal transitions high responsive to the WE signal transitioning high in synchronism with the CK signal, and the WeAsync signal transitions high asynchronously responsive to the WE signal transitioning high.

The decoder circuit 120 performs the function of generating signals that are active in the various modes to de-power certain circuits in the memory device 10, as explained above. The PDE signal, which, as explained above, is high in the precharge power down mode or the active power down mode, is applied to one input of a NOR gate 130. The other input of the NOR gate 130 receives the DPD signal, which, as explained above, is high in the deep power down mode. Thus, the NOR gate 130 outputs an active low PdCmdF signal in either the deep power down mode or in one of the other two power down modes. The low PdCmdF signal sets a flip-flop 134 formed by a pair of cross-coupled NAND gates 136, 138. When the flip-flop is set, the NAND gate 136 outputs an active high POWER DOWN signal. The flip-flop 134 is reset responsive to the WE signal transitioning high, as explained below.

A high POWER DOWN signal is used to generate several control signals. It is applied to one input of an OR gate 140, which also receives the output of a delay circuit 142, which receives the POWER DOWN signal through another delay circuit 144. The delay circuits 142, 144 substantially respond to transitions of the low-to-high transition of the POWER DOWN signal, but they delay responding to transitions of high-to-low transition of the POWER DOWN signal. As a result, the output of the OR gate 140 substantially transitions high responsive to the low-to-high transition of the POWER DOWN signal. The output of the OR gate 140 is applied to one input of a NAND gate 146, which also receives the BnkOn signal. It will be recalled that the BnkOn signal is high whenever a row is active. Therefore, the NAND gate 146 outputs a low, to cause the output of an inverter 148 to output an active high We_PdAct signal in the active power down mode. The high We_PdAct signal causes power to be removed from the components that are powered down in one of the active power down modes, as explained above.

The POWER DOWN signal is also applied to an input of an AND gate 150, which also receives the BnkOnF signal. The AND gate 150 therefore outputs a high in the power down mode only if a row of memory cells is not active, which occurs in the precharge power down mode. The output of the AND gate 150 is applied to an input of an OR gate 154, which also receives a We_Sr signal. As explained below, the We_Sr signal is high in the self-refresh power down mode. Thus, the OR gate 154 outputs a low in either the precharge power down mode or the self-refresh power down mode. The output of the OR gate 154 is applied to an input of an inverter 158, which outputs an active high We_PdSr signal in either the precharge power down mode or the self-refresh power down mode. The high We_PdSr signal causes power to be removed from the components that are de-powered in that mode.

The We_Sr signal is generated at the output of a flip-flop 160 formed by NAND gates 164, 166. The flip-flop 160 is set by a high PDESR signal coupled through an inverter 162. As explained above, the PDESR signal is high in the power down self-refresh mode. Thus, as mentioned above, the We_Sr signal is high in the power down self-refresh mode.

The decoder circuit 120 also generates an active high We_Dpd signal, which is high in the deep power down mode. The We_Dpd signal is generated at the output of a flip-flop 170, which is formed by NAND gates 172, 174. The flip-flop 170 is set by a high DPD signal coupled through an inverter 176. As explained above, the DPD signal is high in the deep power down mode. Therefore, the We_Dpd signal is high in the power down self-refresh mode, and it removes power from almost all of the components of the memory device 10.

The We_Dpd signal applied to the inverter 124 is output to an input of a NAND gate 178. This input to the NAND gate 178 is high whenever the memory device 10 is not in the deep power down mode. The NAND gate 178 also receives a We_PdAct signal, which, as explained below, is high in the active power down mode when the power down mode is entered with a row of memory cells active. Finally, the NAND gate 178 receives a PwrUp signal, which is high during normal operation. The output of the NAND gate 178 is applied to an input of an inverter 180, which generates an active low AsyncF signal. An Async signal is therefore low and the AsyncF signal is low only when the memory device 10 is in the active power down mode. When the memory device 10 is in the deep power down mode, the Async signal is high and the AsyncF signal is low. The Async and AsyncF signals are used by circuitry that will now be explained.

As explained above, the WeAsync signal transitions high asynchronously responsive to the WE signal transitioning high, and the WeSync signal transitions high responsive to the WE signal transitioning high in synchronism with the CK signal. The WeAsync signal is applied to an input of a NAND gate 182 and to the input of a first delay circuit 184, which applies its output to the input of a second delay circuit 186. The output of the second delay circuit 186 is applied to another input to the NAND gate 182. When the WE signal is low, the WeAsync signal and the output of the delay circuit 186 are both low. As a result, the NAND gate 182 outputs a high, which is applied to an inverter 188. The inverter 188 is enabled by the Async signal being high and the AsyncF signal being low. Therefore, as long as the memory device 10 is in the deep power down mode, the inverter 188 is enabled. When the WE signal is low, the inverter 188 outputs a low, which, after being inverted by an inverter 190, causes a high to be applied to the flip-flops 134, 160, 170. This high allows the flip-flops 134, 160, 170 to be set, as explained above.

When the WE signal transitions high, the WeAsync signal asynchronously transitions high. After a delay time provided by the delay circuits 184, 186, the output of the NAND gate 182 transitions low to cause the output of the inverter 190 to transition low. This low resets the flip-flops 134, 160, 170 to terminate the power down signals generated by the decoder circuit 120. Therefore, in the deep power down mode, the power down mode is asynchronously terminated by the WE signal transitioning high.

The WeSync signal, which transitions high in synchronism with the CK signal, is coupled through two inverters 192, 194 to the input of the inverter 190. The inverter 194 is enabled by AsyncF being high and Async being low, which is the opposite state that enables the inverter 188. Therefore, the inverter 194 is enable in all power down modes other than the deep power down mode. When the WeSync signal transitions high, the output of the inverter 190 transitions low to again reset the flip-flops 134, 160, 170.

In summary, in all power down modes but the deep power down mode, the flip-flops 134, 160, 170 are reset in synchronism with the CK signal responsive to the WE signal transitioning high to terminate the power down signals generated by the decoder circuit 120. However, in the deep power down mode when the latch generating the WeSync signal is not powered, the flip-flops 134, 160, 170 are reset asynchronously responsive to the WE signal transitioning high.

Figure 5:
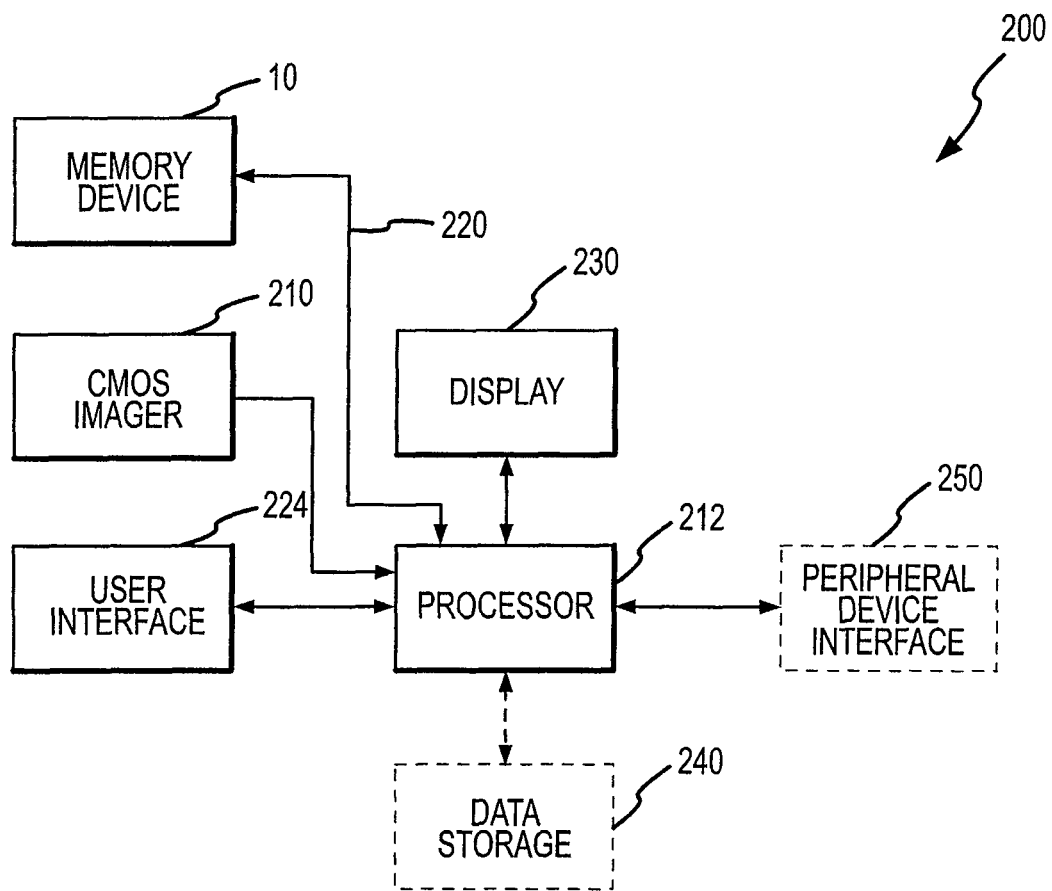
FIG. 5 is a block diagram of an embodiment of an electronic device having a CMOS image and the memory device of FIG. 1 or some other embodiment of the invention.

An embodiment of an electronic device 200 that may use the memory device 10 of FIG. 1 or some other embodiment of the invention is shown in FIG. 5. The electronic device 200 may be, for example, a digital camera, a vehicle navigation system, a videophone, a cell phone, an audio player with imaging capabilities, or other devices that utilize CMOS image sensing technology. The electronic device 200 includes a CMOS imager 210 and a processor 212 that is connected to receive image data from the imager 210. The processor 212 can then store the image data in the memory device 10 for subsequent read-out or display. The processor 212 may be, for example, a microprocessor, digital signal processor, or part of a larger central processing unit that performs other functions. The processor 212 is connected to the memory device 10 through a set of buses 220, which may include a command bus, and address bus and a data bus. The electronic device 200 also includes a user interface 224 connected to the processor through a bus. The electronic device 200 also includes a display 230, such as a cathode ray tube (CRT) or liquid crystal display (LCD), for displaying information captured by the CMOS imager 210. The electronic device 200 may also include a data storage device 240, such as removable Flash memory, capable of non-volatilely storing data processed by processor 212, including, for example, digital image data. The consumer device 200 may optionally also have a peripheral device interface 250 so that the processor 212 may communicate with a peripheral device (not shown), Although the CMOS imager 210 is shown as a separate component, it may be combined with the processor 212 and/or with the memory device 10 on a single integrated circuit or on a different chip.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A method of decoding received command signals in a memory device, the method comprising:
    decoding the received command signals in combination with at least one address signal provided to a memory address node at a first clock edge of a clock signal to generate a plurality of memory control signals,
    wherein the received command signals in combination with the at least one address signal provided to the memory address node at the first clock edge of the clock signal represents a memory command, and
    wherein a plurality of commands are grouped together and assigned a same combination of command signals, the plurality of commands differentiated from each other by the at least one address signal provided to the memory address node.

2. The method of claim 1 wherein the received command signals comprise write enable, row address strobe and column address strobe signals.

3. The method of claim 2 wherein the memory control signals comprise power down control signals.

4. The method of claim 3 wherein the power down control signals comprise a deep power down control signal.

5. The method of claim 3 wherein the power down control signals comprise a power down self-refresh command signal.

6. The method of claim 3 wherein the power down control signals comprise a normal power down command signal that is active to de-power at least one circuit in the memory device in either a precharge power down mode or an active power down mode depending upon the operating mode of the memory device when the normal power down command signal is received.

7. The method of claim 3, further comprising decoding the received command signals to generate a no operation command signal, and wherein a state of the received command signals decoded to generate the no operation command signal differs from the state of the received command signals decoded to generate the plurality of power down command signals differs only in a state of the write enable signal in the received command signals.

8. The method of claim 3, further comprising decoding the received command signals to terminate the power down control signals.

9. The method of claim 8 wherein decoding the received command signals to terminate the power down control signals comprises:
    decoding the write enable signal in synchronism with a clock signal when the memory device is operating in a deep power down mode; and
    asynchronously decoding the write enable signal when the memory device is operating in a power down mode other than the deep power down mode.

10. The method of claim 2 wherein the received command signals represent a mode register load command.

11. A method of decoding received command signals, comprising:
    receiving a plurality of command signals each of which has a first logic level or a second logic level, the plurality of command signals including a write enable signal;
    receiving a plurality of memory address signals each of which has either the first logic level or second logic level; and
    decoding the plurality of command signals to determine memory commands corresponding to a plurality of respective combinations of different logic levels of the plurality of command signals, at least one of the determined memory commands being a reduced power command and at least one of the determined memory commands being a no operation command, a combination of logic levels of the plurality of command signals decoded to determine the reduced power command differing from a combination of logic levels of the plurality of command signals decoded to determine the no operation command only in a logic level of the write enable signal,
    wherein decoding the plurality of command signals to determine memory commands corresponding to the plurality of respective combinations of different logic levels of the plurality of command signals comprises decoding at least one of the received memory address signals in combination with the plurality of command signals to determine memory commands corresponding to plurality of respective combinations of different logic levels of the plurality of command signals and the at least one memory address signal.

12. The method of claim 11 wherein the reduced power command comprises a deep power down command.

13. The method of claim 11 wherein the reduced power command comprises a self-refresh power down command.

14. The method of claim 11 wherein the reduced power command comprises either a precharge power down command or an active power down command depending upon an operating mode when the write enable signal, a row address strobe signal and a column address strobe signal are received.

15. The method of claim 11, further comprising decoding the write enable signal, a row address strobe signal and a column address strobe signal to determine the memory commands corresponding to plurality of respective combinations of different logic levels of the write enable signal, the row address strobe signal and the column address strobe signal that comprises decoding at least one of the memory address signals in combination with the write enable signal, the row address strobe signal and the column address strobe signal to determine the memory commands corresponding to plurality of respective combinations of different logic levels of the write enable signal, the row address strobe signal, the column address strobe signal and the at least one memory address signal.

16. The method of claim 11, further comprising:
detecting a transition of the write enable signal from the first logic level to second logic level regardless of any transitions of a row address strobe signal and a column address strobe signal from one of the logic levels to another; and
terminating an operation being performed responsive to the detecting the transition of the write enable signal.

17. The method of claim 16, further comprising receiving aperiodic clock signal, and wherein at least one of the determined memory commands is a deep power down command and another of the determined memory commands is a different power down command, and wherein terminating the operation being performed responsive to detecting the transition of the write enable signal comprises:
if the reduced power down command being performed is the deep power down command, terminating the operation asynchronously responsive to the detecting the transition of the write enable signal; and
if the reduced power down command being performed is the different power down command, terminating the operation in synchronism with the clock signal in response to the detecting the transition of the write enable signal.

18. A method of decoding received command signals, comprising:
receiving at least one address signal at a command decoder;
decoding the received command signals to perform a first memory operation based on logic states of the received command signals and a first logic state of the at least one address signal on a first clock edge of a clock signal; and
decoding the received command signals to perform a second memory operation based on same logic states of the received command signals and a second logic state of the at least one address signal on the first clock edge of the clock signal,
wherein the first memory operation and the second memory operation are grouped together and assigned a same combination of command signals, the plurality of commands differentiated from each other by the at least one address signal provided to the memory address node.

19. The method of claim 18 wherein decoding the received command signals further comprises:
decoding the received command signals to perform a read operation based on the logic states of the received command signals and the first logic state of at least one address signal on a falling edge of the clock signal and to perform a read operation with auto-precharge based on same logic states of the received command signals and the second logic state of the at least one address signal on the falling edge of the clock signal.

20. The method of claim 18 wherein decoding the received command signals further comprises:
decoding the received command signals to perform a write operation based on the logic states of the received command signals and the first logic state of at least one address signal on a falling edge of the clock signal and to perform a write operation with auto-precharge based on same logic states of the received command signals and the second logic state of the at least one address signal on the falling edge of the clock signal.

21. The method of claim 18 wherein decoding the received command further comprises:
decoding the received command signals to perform loading of mode registers based on the logic states of the received command signals and the first logic state of at least one address signal on a rising edge of the clock signal and based on same logic states of the received command signals and the second logic state of the at least one address signal on the rising edge of the clock signal.

22. The method of claim 18 wherein decoding the received command signals further comprises:
decoding the received command signals to perform a power down operation based on the logic states of the received command signals and the first logic state of at least one address signal on a rising edge of the clock signal and to perform loading of a power down self-refresh operation based on same logic states of the received command signals and the second logic state of the at least one address signal on the rising edge of the clock signal.

23. The method of claim 22 wherein decoding the received command signals to perform a power down or operation or a power down self-refresh operation comprises decoding the received command signals to perform a deep power down operation based on same logic states of the received command signals and a logic state of another address signal on the rising edge of the clock signal.

24. The method of claim 18 wherein the received command signals consist of RAS, CAS, and WE signals.

* * * * *